United States Patent [19]
Barile et al.

[11] 3,793,090
[45] Feb. 19, 1974

[54] METHOD FOR STABILIZING FET DEVICES HAVING SILICON GATES AND COMPOSITE NITRIDE-OXIDE GATE DIELECTRICS

[75] Inventors: Conrad Albert Barile, Wappingers Falls; Robert Charles Dockerty, Highland; Arunachala Nagarajan, Wappingers Falls, all of N.Y.

[73] Assignee: International Business Machines Corporation, Armonk, N.Y.

[22] Filed: Nov. 21, 1972

[21] Appl. No.: 308,608

[52] U.S. Cl. .................... 148/1.5, 29/571, 117/201, 148/33.3, 148/187, 148/189, 317/235
[51] Int. Cl. ............................................ H01l 7/34
[58] Field of Search ... 148/1.5, 33.3, 175, 187, 189; 317/235; 117/201; 29/571

[56] References Cited

UNITED STATES PATENTS

| | | | |
|---|---|---|---|
| 3,514,676 | 5/1970 | Fa | 148/33.3 UX |
| 3,615,873 | 10/1971 | Sluss et al. | 148/1.5 |
| 3,670,403 | 6/1972 | Lawrence et al. | 29/571 |
| 3,699,646 | 10/1972 | Vadasz | 148/187 |

*Primary Examiner*—Hyland Bizot
*Assistant Examiner*—J. Davis
*Attorney, Agent, or Firm*—Thomas F. Galvin

[57] ABSTRACT

Large threshold voltage shifts of silicon gate FET devices having a composite nitride-oxide gate dielectric are greatly reduced by subjecting the nitride to a dry oxygen annealing at temperatures between 970°–1,150°C prior to depositing the silicon gate electrode. Annealing at 1,050°C applied for a duration of one-half to one hour produces excellent results.

11 Claims, 11 Drawing Figures

METHOD FOR STABILIZING FET DEVICES HAVING SILICON GATES AND COMPOSITE NITRIDE-OXIDE GATE DIELECTRICS

BACKGROUND OF THE INVENTION

1. Field of the Invention

This invention relates to stabilizing insulated gate field effect transistor devices. In particular, it relates to stabilizing the threshold voltage of a field effect transistor utilizing silicon as the gate electrode and a composite gate dielectric of silicon nitride/silicon dioxide.

2. Description of the Prior Art

In recent years much development has been undertaken on insulated gate field effect transistors (IGFET's) which utilize a silicon dioxide-silicon nitride composite gate dielectric. Silicon nitride is used in the gate dielectric because of its high dielectric strength and dielectric constant, its ability to mask against diffusions and oxidation and its resistance to penetration by positively charged ions. However, these MNOS or SNOS IGFET's suffer from threshold voltage ($V_T$) shifts when stressed by a gate voltage at elevated temperatures.

Voltage-temperature stressing of integrated circuits is a commonly used technique to predict the long-term performance and reliability of devices when installed in commercial products.

$V_T$ shift has been observed in many types of FET devices in which the gate dielectric is a composite of silicon nitride and silicon dioxide. A paper by Frohman-Bentchkowsky et al. entitled "Charge Transport in . . . (MNOS) Structures", *Journal of Applied Physics*, Vol. 40, No. 8, July 1969, page 3307 et seq. demonstrated that in these devices charge accumulates near the nitride-oxide interface. It is believed that these charges move when a bias is applied to the gate electrode, thereby causing large variations in threshold voltage in completed devices. Other contributions to interface charge accumulations are sodium ion contaminants.

Those skilled in the art of manufacturing transistors are well aware that surface states in dielectrics may be removed by annealing in an inert gas at an elevated temperature. It, therefore, appeared that annealing the nitride/oxide composite dielectric in nitrogen or hydrogen at an elevated temperature might stabilize the threshold voltage of devices using nitride/oxide dielectrics. This has not proven to be effective.

SUMMARY OF THE INVENTION

It is, therefore, an object of this invention to improve the stability of field effect devices utilizing silicon as the gate electrode and a composite of silicon dioxide/silicon nitride as the gate dielectric.

This object and other objects are achieved by annealing the nitride-oxide layer in oxygen at temperature ranges between 970°C to 1,150°C. The preferred temperature is 1,050°C, at which uniformly excellent results are achieved. Annealing temperatures above and below this range yield poor results.

DESCRIPTION OF THE INVENTION

This invention is practiced after the silicon oxide and silicon nitride layers are applied to a silicon substrate and prior to the deposition of the silicon gate electrode. Except for the inventive annealing step, the devices are fabricated by the standard "Self-Aligned Gate" process. It is deemed advisable, however, to describe the fabrication of the preferred P channel device in order to clarify the invention and to place it in context.

Figure 1A:
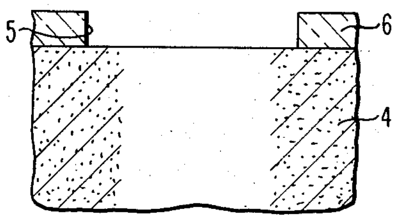
FIGS. 1A–1D are cross-sectional views of a field effect device fabricated in accordance with the present invention.

FIG. 1A shows a semiconductor substrate 4 which is N type silicon in the <100> crystallographic orientation and having a typical resistivity of about 2 ohms-cm. A thick oxide layer 6 having a window 5 is formed over the surface of substrate 4. Insulator 6 is preferably thermally grown silicon dioxide having a thickness of around 8,000 A to 15,000 A.

Figure 1B:
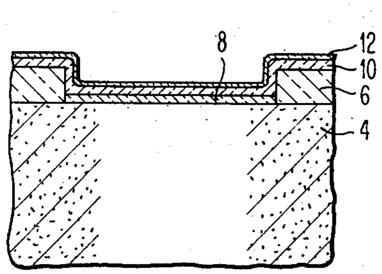

In FIG. 1B there is shown an oxide layer 8, which will function as the gate oxide. Layer 8 is around 300 A in thickness and is preferably formed from the silicon layer 4 by heating the device in dry oxygen at 970°C. The preferred range of thickness for the gate oxide, $t_{ox}$, is from 200–900 A. A nitride layer 10 is then deposited over layer 8. Layer 10 is preferably 300 A thick and is formed in a gaseous atmosphere of $SiH_4 + NH_3$ in a $N_2$ carrier at 800°C. The preferred range of the gate nitride, $t_n$, is between 100 to 350 A.

It is at this point in the process that the inventive oxygen annealing step is performed.

The annealing step forms a very thin layer 12 having the apparent chemical composition $Si_x N_Y O_Z$ which increases the resistivity of the silicon nitride layer 10. It is believed that annealing reduces the conductivity mismatch between nitride layer 10 and oxide layer 12 and that this in turn leads to the reduction in voltage threshold shift. However, as will be obvious from the data presented hereafter, the behavior of $V_T$ is quite complex and our hypothesis may be only partially correct or incorrect.

Figure 1C:
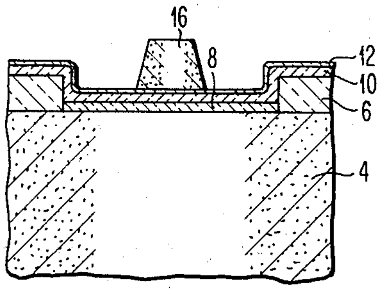

FIG. 1C shows the device after polycrystalline silicon gate 16 has been formed. The fabrication is preferably performed using a process which is known as the self-aligned gate process. This process is well-known to those of skill in the art and a detailed description is unnecessary. Other processes could be used as well.

Polysilicon gate 16 is commonly formed by decomposing $SiH_4$ in a carrier of $H_2$ gas at about 800°C. In the present invention it has been found desirable to utilize a two-step deposition process to obtain smooth polysilicon. In the first step, 500 A. of polycrystalline silicon is formed by depositing $SiH_4$ in a $N_2$ carrier at 800°C. Subsequently, 6,500 A of polycrystalline silicon is formed by decomposing $SiH_4$ in a $H_2$ carrier at 800°C. Polysilicon electrode 16 is made conductive by doping it with a P type impurity. Commonly, $BBr_3$ diffusion process is used to achieve a doping level of around $10^{19}/cm^3$ in gate 16. The same diffusion is used to dope source and drain regions 18 and 19.

Figure 1D:
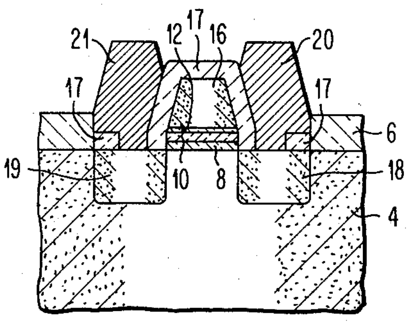

FIG. 1D illustrates a completed field effect transistor device. A thick oxide layer 17 covers gate 16. Layer 17 is commonly formed by first oxidizing the polycrystalline silicon in dry $O_2$ at 1,050°C to form a layer 850 A. thick. Subsequently, a layer of $SiO_2$ is pyrolytically deposited to form a layer 17 which is 6,500 A. in total thickness. The P type source and drain regions 18 and 19 are commonly formed by a $BBr_3$ diffusion process to form regions having a sheet resistivity of 15 ohms per square and a depth of around 50 microinches. Aluminum electrodes 20 and 21 are then deposited to form ohmic contacts with the source and drain regions.

The process previously described is utilized to fabricate a P-channel field effect transistor having as the gate electrode polycrystalline silicon which is heavily doped with P type impurity. It has been found that the annealing process of the present invention is very effective in stabilizing the threshold voltage of such a device. Moreover, the annealing process has also been utilized with good results on N channel devices using both P and N doped polycrystalline silicon gates. The impurity in the N doped polycrystalline silicon gates is commonly phosphorus. Thus, the present invention has broad applications for P channel, N channel and complementary field effect transistors which use polycrystalline silicon as the gate electrode and a composite gate dielectric of silicon dioxide/silicon nitride.

Figure 2:
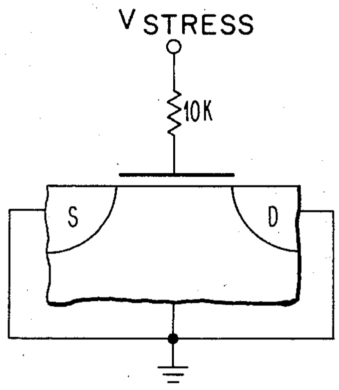
FIG. 2 is a schematic of a field effect device under temperature-bias stress.

FIG. 2 shows the schematic diagram of a FET under stress conditions. In the preferred test circuit, the value of $V_{STRESS}$ on the gate of the device is ± 14 volts at ambient temperatures of 150°– 200°C. The source, drain and substrate of the device are grounded, although the source and drain might also be left floating.

The measurement of the average threshold shift, $\Delta V_T$, in FET's involves measuring $V_T$ for a number of completed devices on a semiconductor wafer, stressing the same devices as explained above, and measuring $V_T$ again in these devices, thereby arriving at $\Delta V_T$.

Figure 3:
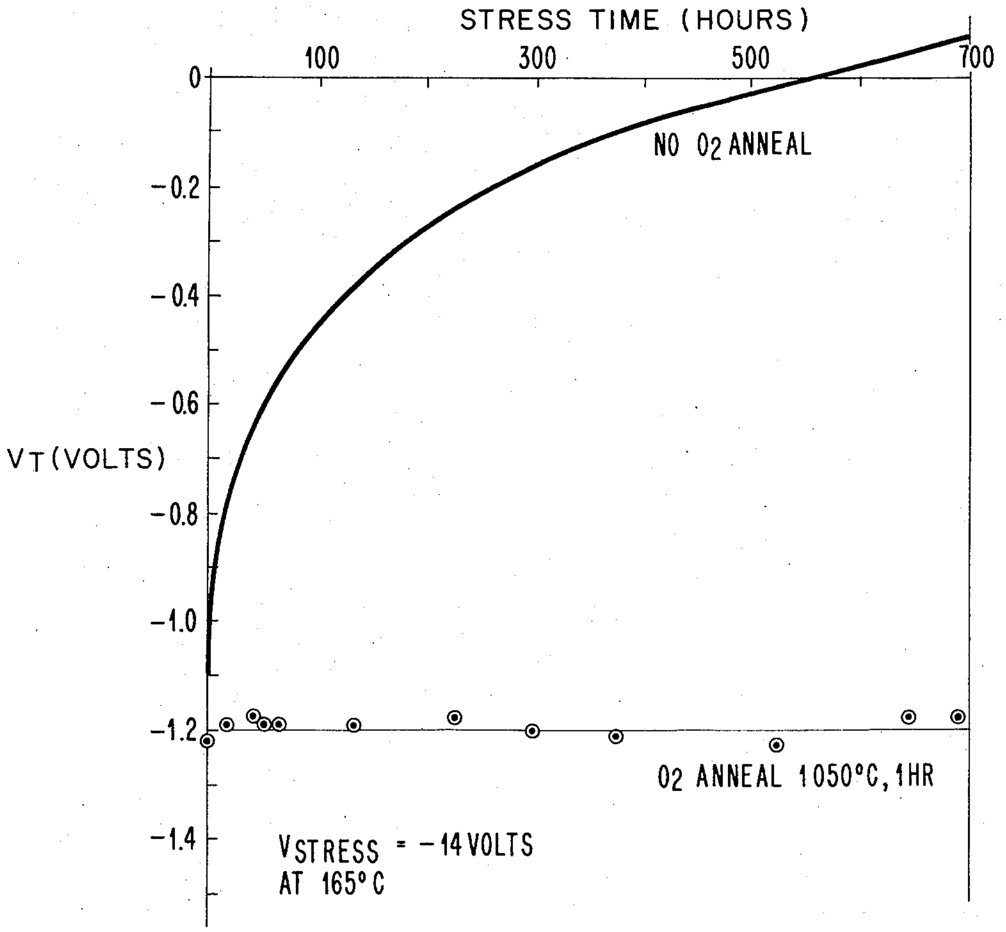
FIG. 3 is a graph illustrating the variation in threshold voltage of field effect devices which have been annealed in accordance with the present invention as compared to those which have not.

It has been found that an oxygen annealing step of ½ hour or 1 hour duration at 1,050°C produces the best $V_T$ stability. As previously explained, the annealing takes place after the nitride layer 10 in FIG. 1B has been deposited and prior to the deposition of the polycrystalline gate electrode. FIG. 3 is a graph of threshold voltage versus time under stress for a number of device samples which illustrates the substantial effect which annealing has on the devices.

Each point on the lower curve represents the average threshold voltage for the devices after they had been stressed for the given number of hours. It is noted that the threshold voltage for devices stressed for over 500 hours is practically the same as the threshold voltage for the devices prior to being stressed and that the maximum threshold voltage shift is less than 50 mv. For devices which were unannealed, however, the threshold voltage increases sharply as a function of stress time. The threshold voltage shift after 500 hours of stressing is greater than 1,000 mv.

Table I illustrates the effect of oxygen annealing at various annealing temperatures on the variation in threshold level, $\Delta V_T$, for P channel transistors fabricated in accordance with FIGS. 1A–1D.

TABLE I $V_T$ STABILITY OF P CHANNEL FET DEVICES

| Wafer Number | $O_2$ Anneal Temp. | $O_2$ Anneal Duration (Hours) | Stress time 165°C (Hours) | $\Delta V_T$ Stress Voltage = +14V (mv) | $\Delta V_T$ Stress Voltage = −14V (mv) |
|---|---|---|---|---|---|
| 33–7 | NONE | NONE | 1 | 274 | −46 |
| 33–3 | 800°C | 1.0 | 1 | 375 | −7 |
| 33–4 | 800°C | 1.0 | 1 | 217 | −28 |
| 33–5 | 900°C | 1.0 | 1 | 222 | −4 |
| 33–6 | 900°C | 1.0 | 1 | 320 | −8 |
| 33–8 | 1050°C | 1.0 | 1 | 8 | +9 |
| 33–9 | 1200°C | 0.5 | 1 | 54 | 9 |
| 33–10 | 1200°C | 0.5 | 1 | 42 | 9 |
| 30–3 | 970°C | 1.0 | 16 | +134 | −27 |
| 30–4 | 970°C | 1.0 | 16 | 158 | −22 |
| 30–5 | 1050°C | 0.5 | 16 | 39 | +13 |
| 30–6 | 1050°C | 0.5 | 16 | 30 | 19 |
| 30–7 | 1050°C | 1.0 | 16 | 47 | 26 |
| 30–8 | 1050°C | 1.0 | 16 | 47 | 18 |
| 30–9 | 1150°C | 0.5 | 16 | 85 | 17 |
| 30–10 | 1150°C | 0.5 | 16 | 61 | 20 |

TABLE II $V_{FB}$ STABILITY OF CAPACITORS

| Wafer Number | $O_2$ Anneal Temp. | $O_2$ Anneal Duration (Hour) | Stress Time 165°C (Hour) | $\Delta V_{FB}$ Stress Voltage + +14V (MV) | $\Delta V_{FB}$ Stress Voltage + −14V (MV) |
|---|---|---|---|---|---|
| 33–7 | NONE | NONE | 1 | −325 | −60 |
| 33–3 | 800°C | 1.0 | 1 | −335 | −55 |
| 33–5 | 900°C | 1.0 | 1 | −240 | −45 |
| 30–3 | 970°C | 1.0 | 1 | −120 | −20 |
| 30–4 | 970°C | 1.0 | 1 | −140 | −15 |
| 30–5 | 1050°C | 0.5 | 1 | −190 | −20 |
| 30–6 | 1050°C | 0.5 | 1 | −160 | −20 |
| 30–7 | 1050°C | 1.0 | 1 | −115 | −10 |
| 30–8 | 1050°C | 1.0 | 1 | −130 | −10 |
| 33–8 | 1050°C | 1.0 | 1 | −150 | −20 |
| 30–9 | 1150°C | 0.5 | 1 | −240 | −15 |
| 30–10 | 1150°C | 0.5 | 1 | −190 | −10 |
| 33–9 | 1200 C | 0.5 | 1 | −700 | −15 |
| 33–10 | 1200°C | 0.5 | 1 | −630 | −17 |

Each wafer, identified by lot number and wafer number within the lot, for example 30–3, consisted of a number of transistors which were subjected to an oxygen anneal at a selected temperature and duration. Subsequently, a gate stress voltage, $V_{STRESS}$, +14 volts for certain of the transistors and −14 volts for others of the transistors was applied for a selected number of hours, either 1 hour or 16 hours, at an ambient temperature of 165°C.

For example, a number of transistors fabricated on wafer number 30–5 were oxygen annealed at 1,050°C for .5 hours. Subsequently, after the fabrication process was complete, a number of the transistors were subjected to a stress voltage of +14 volts for 16 hours at 165°C and others of the transistors on the same wafer were subjected for −14 volts under the same conditions. For the positive $V_{STRESS}$, i.e. +14 volts, the average change in threshold voltage, $\Delta V_T$, measured before and after the stress amounted to 39 mv. For the transistors subjected to a negative stress voltage, the average change in threshold voltage was 13 mv.

The data in Table I indicates that $\Delta V_T$ is much greater for a positive $V_{STRESS}$ than for a negative $V_{STRESS}$ over the entire annealing temperature range. It is also evident that annealing temperatures of from 970°C to 1,200°C yield good stability on the average for both positive and negative stress voltages. Assuming that the magnitude of the $V_T$ shift should be less than 150 mv. for all stress conditions, then the annealing range between 970° and 1,200°C is acceptable, with the range between from 1,050° to 1,200°C being the preferred range for small P-channel FET devices having dimensions of 0.35 by 2 mils. It also can be seen that if it were possible to predict that the devices would be stressed only by negative voltages under operating conditions, then any annealing temperature between 800°C and 1,200°C would suffice. However, it is generally not possible to make such a prediction in advance; and devices can expect to experience both positive and negative stress conditions. Therefore, the annealing temperatures of 800 and 900°C are unsatisfactory.

A thorough study of insulated gate FET devices includes the manufacture of large capacitors having dielectrics and metallization layers fabricated similarly to the small active devices. There are many reasons for studying the stability of large capacitors, which are commonly 10 × 10 square mils in area. Firstly, the larger device is easier to fabricate to a particular tolerance. Secondly, the parameters of the device are easier to measure for reasons of ease of contact to the various testing devices, such as electrical probes. Thirdly, modern circuit design contemplates the integration of power drivers and sense amplifiers on the same chip as the smaller FET devices. For example, the small FET devices described in this application might comprise the elements of a large scale memory array. Associated with the array are input drivers and output sense amplifiers as well as various read/write circuits which would be fabricated on the same chip and which would be larger than the array devices. The 10 × 10 square mil capacitor would, for example, correspond roughly in size to a power driver on a memory array. Therefore, it is important to investigate the effects of annealing on large capacitors.

Figure 4:
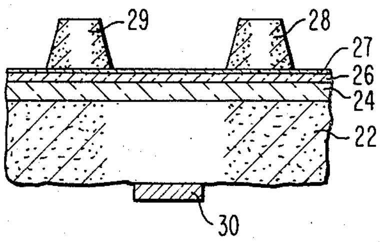
FIG. 4 is a schematic of a SNOS capacitor fabricated in accordance with the present invention.

The SNOS capacitor shown in FIG. 4 was used to more accurately determine the stability of the nitride/oxide gate structure. The capacitor comprises a semiconductor substrate 22, silicon dioxide layer 24, silicon nitride layer 26, doped polycrystalline silicon gates 28 and 29 and an aluminum contact 30. The similarity between the structure of FIG. 4 and FIG. 1C is apparent. When the capacitors are annealed according to the present invention prior to the deposition of the polysilicon gates, a very thin layer 27 of $Si_XO_YN_Z$ is formed atop silicon nitride layer 26.

To simulate P channel devices, the capacitor is fabricated on an N type substrate bearing a resistivity of 2 ohms-cm and polycrystalline silicon gates which are doped with boron using a $BBr_3$ diffusion process. The thicknesses of the oxide layer 24 and nitride layer 26 were in the same range as the P channel device discussed previously, i.e., the oxide range from 200 to 900 A. and the nitride range of 100 to 350 A.

The flatband voltage shift, $\Delta V_{fb}$, was measured as a function of stress voltage, temperature and duration for devices which were annealed in oxygen after the deposition of nitride layer 26 and for devices which were not so annealed. As is well-known to those of skill in the semiconductor device sciences, flatband voltage shift in SNOS capacitors is a measure of the same dielectric parameters as threshold voltage shift in SNOS FET's.

Figure 5A:
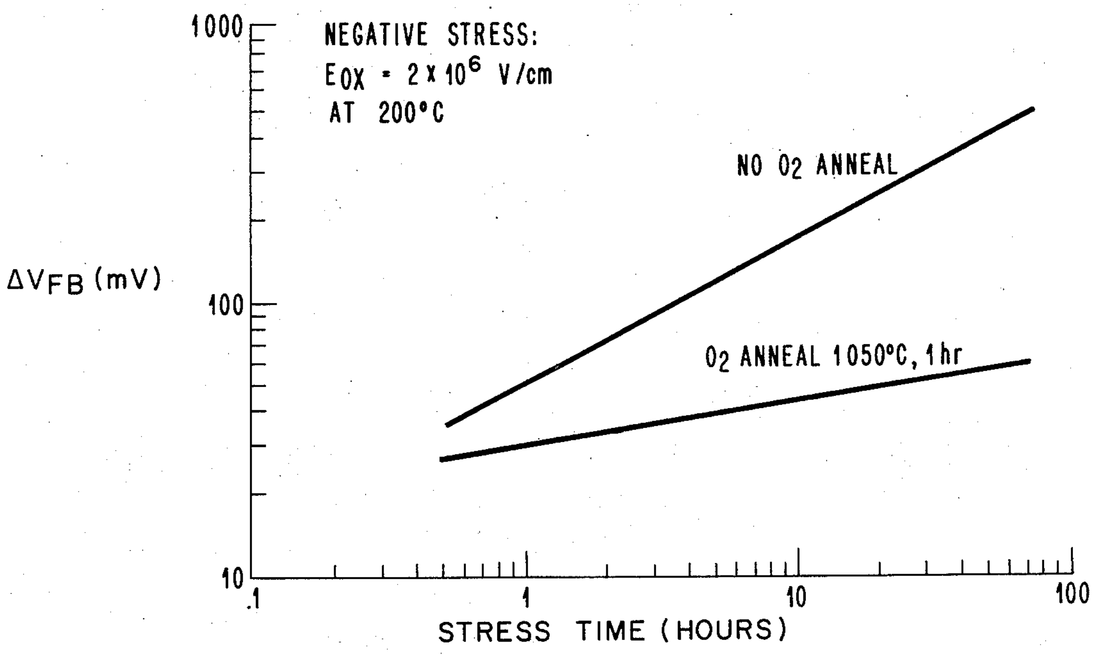
FIGS. 5A and 5B are graphs illustrating the flatband voltage change, $\Delta V_{FB}$, in SNOS capacitors which have been annealed in accordance with the present invention as compared to those which have not.
Figure 5B:
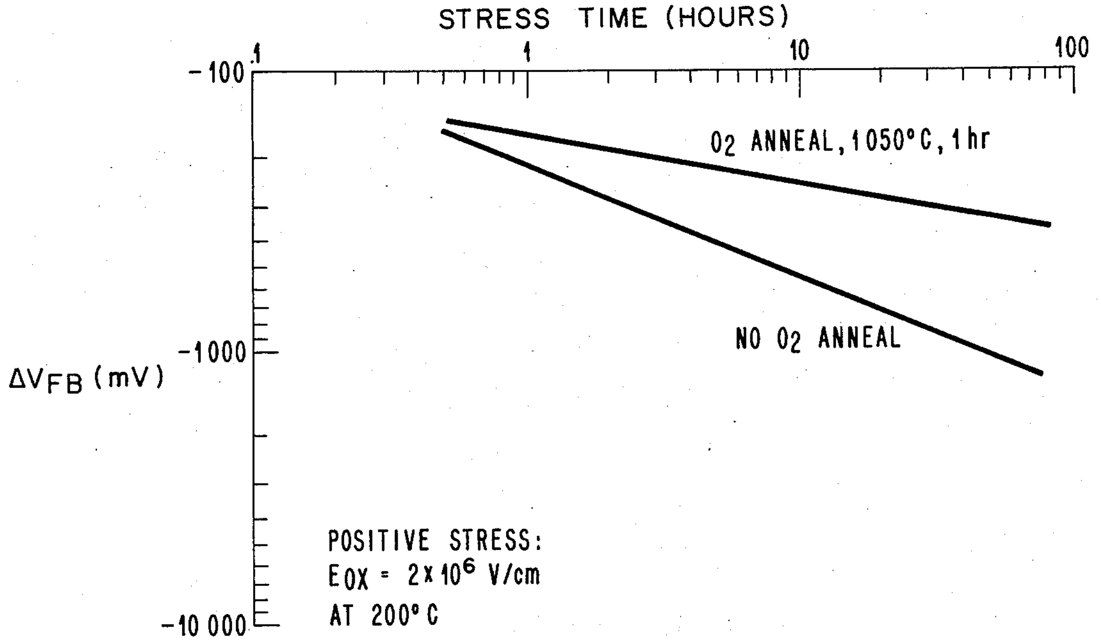

FIGS. 5A and 5B illustrate that the flatband voltage shift, $\Delta V_{fb}$, is markedly decreased in devices which are annealed in oxygen at 1,050°C for 1 hour than for those which are not. This is true for devices which are stressed by a negative field, $E_{OX}$, of $2 \times 10^6$ volts per cm at 200°C and for devices which are stressed in a positive field of the same magnitude and temperature. Moreover, the difference between oxygen annealing and not annealing becomes more significant as the stress time increases. As is done on the small FET devices, the stress voltage is applied to either gate 28 or 29 on the capacitor and the substrate is grounded. The stress voltage, $V_{STRESS}$ on the gate is adjusted to produce the desired field across the dielectric of $2 \times 10^6$ volts per cm. Equation (1) can be used to calculate stress voltage: $V_{STRESS} = E_{OX} \times t_{eq} = 2 \times 10^6\ C_{MAX} / K_{OX}\ \epsilon\ Ag$ 1.

where $t_{eq} = t_{OX} + [t_n \times (K_{OX}/Kn)]$

In the equation:

$K_{OX}$ and $Kn$ are the dielectric constants of the oxide and nitride, respectively;

$\epsilon_O = 8.85 \times 10^{-14}$ farads per cm.;

$C_{MAX}$ is the capacitance measured when the sample is biased in the accumulation region; and $Ag$ is the area of the gate electrode.

A significant finding with respect to the stability of the capacitors is that annealing in oxygen at 1,200°C is much less effective than annealing at 1,050° or 1,100°C. This difference is well illustrated in the graphs of FIGS. 6A and 6B. For both positive and negative stresses the flatband voltage shift for capacitors annealed at 1,200°C is substantially larger than for those annealed at 1,050°C, particularly for positive stress voltages. Moreover, even for negative stresses the difference tends to increase as the time under stress increases.

Figure 6A:
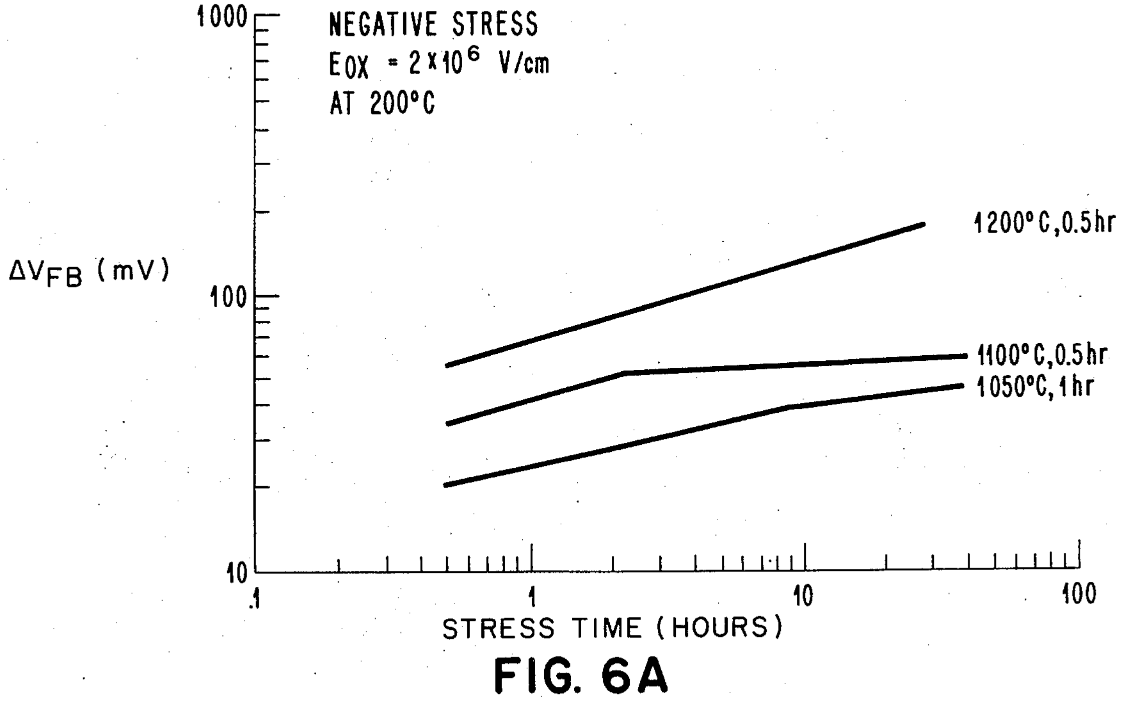
FIGS. 6A and 6B are graphs illustrating $\Delta V_{FB}$ in SNOS capacitors which have been annealed in oxygen at various annealing temperatures.
Figure 6B:
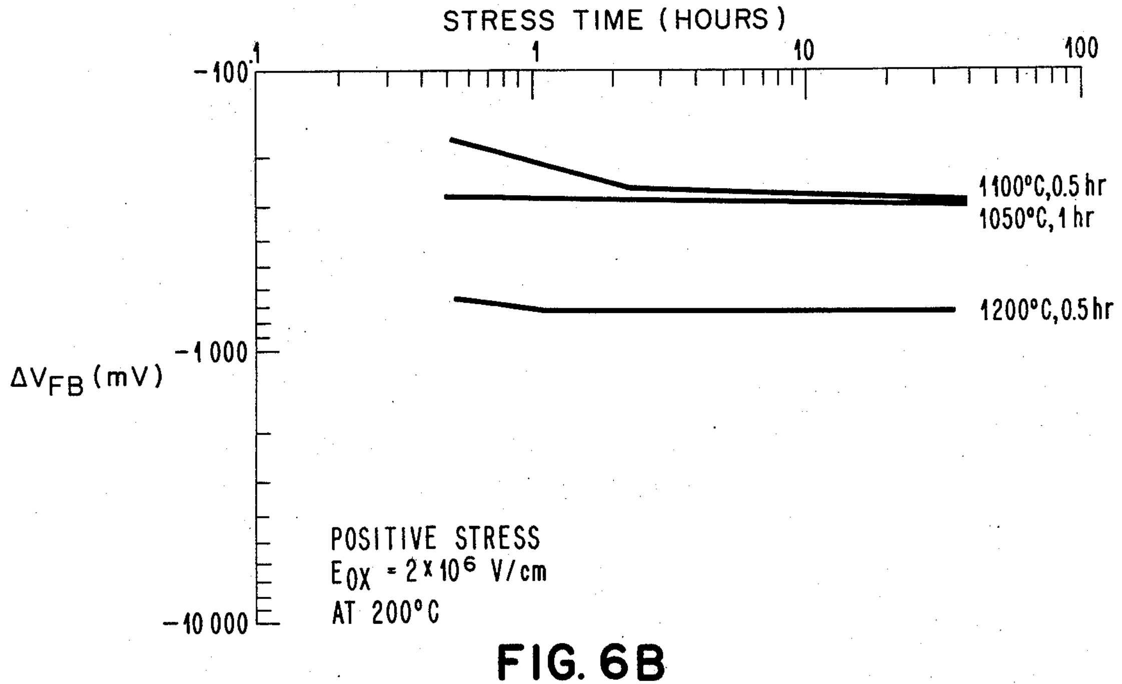

Although the plots of FIGS. 5 and 6 are made for the same variables, $\Delta V_{fb}$ versus stress time, a direct correlation between the two graphs is not possible because the measurements were made on different wafer runs. Thus, the oxygen annealing at 1,050°C in FIGS. 5A and 5B cannot be directly correlated with the oxygen annealing at 1,050°C for 1 hour in FIGS. 6A and 6B. However, the overall effect of the two graphs is to show that an oxygen anneal at 1,050°C on capacitors offers significant improvement in flatband voltage shift over devices which are not annealed or in devices which are annealed at 1,200°C.

Table II illustrates the effect of oxygen annealing on the $V_{fb}$ stability of SNOS capacitors. The capacitors in Table II were fabricated on the same wafers as the devices shown in Table I. Thus the outline and scope of Table II is the same as Table I except for the measurement in Table II of $V_{fb}$ instead of $V_T$. The effect of the 1,200°C anneal for 0.5 hours is noted to be deleterious rather than beneficial as compared to no annealing whatever. Annealing at 1,050° and 1,150°C is beneficial as compared no annealing for positive stress voltages. These results are quite surprising and cannot be explained by any theory known to the present inventors. What is very clear, however, is that an annealing step between 970° and 1,150°C is beneficial as compared to no annealing at all, with annealing at 1,050°C for 1 hour offering uniformly excellent results. Annealing at temperatures outside of this relatively narrow range is to be avoided.

The results recited above have been limited to P channel devices or devices wherein the gates are doped with P type material. However, the invention is not so limited. For example, a N channel FET having the same dimensions as the P channel FET is shown in FIG. 1D was fabricated in accordance with the present invention and annealed in dry oxygen at 1,050°C for 1 hour.

The results showed a smaller variation of threshold voltage than for N channel devices which were not so annealed.

In summary, it has been demonstrated that the threshold voltage stability of small and large silicon gate FET's has been greatly improved by oxygen annealing the silicon nitride within the specified temperature range. The annealing step changes the magnitude of the threshold voltage by between 75 to 150 mv. on the average; but aside from this no other device parameters are significantly affected.

While the invention has been particularly shown and described with reference to preferred embodiments thereof, it will be understood by those skilled in the art that the foregoing and other changes in form and details may be made without departing from the spirit and scope of the invention.

We claim:

1. A method for stabilizing the threshold voltage of a silicon gate FET device having a composite gate dielectric of silicon nitride and silicon oxide comprising:

annealing the device after the deposition of said nitride and prior to the deposition of said silicon gate in an atmosphere of dry oxygen at a temperature of between 970° and 1,150°C.

2. The method as in claim 1 wherein said temperature is 1,050°C.

3. A method as in claim 1 wherein said FET device is a P channel device and said silicon gate is doped with a P type impurity.

4. A method as in claim 1 wherein the thickness of said nitride layer lies between 100 and 350 A. and the thickness of said oxide layer lies between 200 and 900 A.

5. A method as in claim 4 wherein the thickness of each of the nitride and oxide layers is 300 A.

6. A method as in claim 1 wherein the duration of said annealing step is one hour or less.

7. A method for stabilizing the threshold voltages of silicon gate FET devices of different dimensions and voltage characteristics formed in a monolithic structure, each device having a composite gate dielectric of silicon nitride and silicon oxide comprising:

annealing the monolithic structure after the deposition of said nitride and prior to the deposition of said silicon gates in a dry oxygen atmosphere at a temperature between 970° and 1,150°C.

8. A method for stabilizing the threshold voltage of a silicon gate FET device having a composite gate dielectric of silicon nitride and silicon oxide comprising:

annealing the device after the deposition of said nitride and prior to the deposition of said silicon gate in an atmosphere of oxygen at a temperature of between 970° and 1,150°C.

9. A method as in claim 8 wherein the thickness of said nitride layer lies between 100 and 350 A. and the thickness of said oxide layer lies between 200 and 900 A.

10. A method as in claim 9 wherein the thickness of each of the nitride and oxide layers is 300 A.

11. A method for stabilizing the threshold voltages of silicon gate FET devices of different dimensions and voltage characteristics formed in a monolithic structure, each device having a composite gate dielectric of silicon nitride and silicon oxide comprising:

annealing the monolithic structure after the deposition of said nitride and prior to the deposition of said silicon gates in an oxygen atmosphere at a temperature between 970° and 1150°C.

* * * * *